United States Patent
Han et al.

(10) Patent No.: US 10,074,824 B2
(45) Date of Patent: Sep. 11, 2018

(54) FLEXIBLE DISPLAY DEVICE

(71) Applicant: LG Display Co., Ltd., Seoul (KR)

(72) Inventors: Mijin Han, Paju-si (KR); Seunghee Lee, Goyang-si (KR); Daeyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/717,728

(22) Filed: Sep. 27, 2017

(65) Prior Publication Data
US 2018/0097197 A1 Apr. 5, 2018

(30) Foreign Application Priority Data

Sep. 30, 2016 (KR) ........................ 10-2016-0127133

(51) Int. Cl.
| | |
|---|---|
| *H01L 51/52* | (2006.01) |
| *H01L 51/00* | (2006.01) |
| *H05K 5/00* | (2006.01) |
| *H05K 5/03* | (2006.01) |
| *G02F 1/1333* | (2006.01) |
| *G06F 1/16* | (2006.01) |
| *G09F 9/30* | (2006.01) |
| *H01L 27/32* | (2006.01) |

(52) U.S. Cl.
CPC .... *H01L 51/5237* (2013.01); *G02F 1/133305* (2013.01); *G06F 1/1652* (2013.01); *G09F 9/301* (2013.01); *H01L 51/0097* (2013.01); *H05K 5/0017* (2013.01); *H05K 5/03* (2013.01); *H01L 27/3244* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,730,657 B2 * | 5/2014 | Ramrattan | ............ | H05K 1/148 |
| | | | | 345/179 |
| 2014/0226275 A1 * | 8/2014 | Ko | ........................ | G06F 1/1626 |
| | | | | 361/679.27 |

(Continued)

FOREIGN PATENT DOCUMENTS

| | | |
|---|---|---|
| EP | 2 993 870 A1 | 3/2016 |
| WO | 2015/178391 A1 | 11/2015 |

OTHER PUBLICATIONS

Extended European Search Report dated Feb. 13, 2018 for the European patent application No. 17193972.1.

*Primary Examiner* — Lisa Lea Edmonds
(74) *Attorney, Agent, or Firm* — Polsinelli PC

(57) ABSTRACT

A flexible display device is disclosed. The flexible display device includes a flexible display panel and a back cover disposed on a back surface of the flexible display panel and having a plurality of opening patterns provided in the third region. The plurality of opening patterns include opening patterns arranged in odd-numbered columns along the first direction and opening patterns arranged in even-numbered columns along the first direction. Each of the opening patterns includes a first portion having a width becoming smaller in a second direction intersecting with the first direction as the first portion progresses along the first direction and a second portion extending from the first portion and having a width becoming greater in the second direction as the second portion progresses along the first direction.

20 Claims, 17 Drawing Sheets

(56) References Cited

U.S. PATENT DOCUMENTS

| | | | |
|---|---|---|---|
| 2017/0117336 A1* | 4/2017 | Rappoport | H01L 27/3227 |
| 2017/0188471 A1* | 6/2017 | Fan | G06F 1/1601 |
| 2017/0294495 A1* | 10/2017 | Shyu | G06F 3/041 |
| 2017/0364187 A1* | 12/2017 | Zhai | G02F 1/133305 |
| 2018/0032189 A1* | 2/2018 | Lee | G06F 3/0412 |
| 2018/0033830 A1* | 2/2018 | Kim | G09G 3/3233 |
| 2018/0033831 A1* | 2/2018 | An | H01L 27/323 |
| 2018/0033832 A1* | 2/2018 | Park | G06F 1/1652 |
| 2018/0033833 A1* | 2/2018 | An | H01L 27/323 |
| 2018/0033834 A1* | 2/2018 | Jun | G06F 3/0412 |
| 2018/0040576 A1* | 2/2018 | Kim | H01L 24/06 |
| 2018/0052493 A1* | 2/2018 | Hong | G06F 1/1652 |
| 2018/0081219 A1* | 3/2018 | Kim | G02F 1/136 |
| 2018/0088631 A1* | 3/2018 | Park | G06F 1/1643 |

* cited by examiner outer bending

Inner bending (Comparative example 2)      (Another Aspect of the Disclosure)

FLEXIBLE DISPLAY DEVICE

CROSS-REFERENCE TO RELATED APPLICATION

This application claims the priority benefit of Korean Patent Application No. 10-2016-0127133 filed on Sep. 30, 2016, which is incorporated herein by reference in its entirety for all purposes as if fully set forth herein.

BACKGROUND

Field of the Disclosure

The present disclosure relates to a display device, and more particularly to a flexible display device.

Description of the Background

With the advancement of information technologies, demands for display devices which enable a user to access information have increased. Accordingly, various types of the display devices are widely used, such as an organic light emitting diode (OLED) display device, a liquid crystal display (LCD), and a plasma display panel (PDP).

Since the organic light emitting diode display device is a self-emissive, power consumption is lower than that of a liquid crystal display device requiring a backlight. In addition, the organic light emitting diode display device can be made thinner than the liquid crystal display device. Further, the organic light emitting diode display device has a wide viewing angle and a high response speed. The organic light emitting diode display device is expanding the market while competing with the liquid crystal display device by developing process technology up to the level of large-screen mass production technology.

Pixels of the organic light emitting diode display device include organic light emitting diodes (OLEDs) which are self-emissive elements. The organic light emitting diode display device may be variously divided depending on kinds of light emitting materials, light emitting methods, light emitting structures, driving methods, and the like. The organic light emitting diode display device may be divided into a fluorescent emission and a phosphorescent emission depending on a light emitting method and may be divided into a top emission structure and a bottom emission structure depending on a light emitting structure. In addition, the organic light emitting diode display device may be divided into a passive matrix OLED (PMOLED) and an active matrix OLED (AMOLED) depending on a driving method.

Recently, a flexible display device has been commercialized. The flexible display device can reproduce input images on a screen of a display panel on which a plastic OLED is formed. The plastic OLED is formed on a flexible plastic substrate. The flexible display device can be implemented in various designs, and has advantages in portability and durability. The flexible display device can be implemented in various forms such as a bendable display device, a foldable display device, and a rollable display device. Such a flexible display device can be applied not only to a mobile device such as a smart phone and a tablet PC but also to a television (TV), an automobile display, and a wearable device, and the application field thereof is expanding.

A flexible display panel of the flexible display device can be bent or unbent as needed. In order to facilitate the bending or unbending operation and to provide design aesthetics, the flexible display panel preferably has a thin thickness and low self-weight. However, as the flexible display panel becomes thinner and lighter, physical durability is inevitably lowered. Accordingly, the flexible display panel can be easily damaged by an external force provided, which lowers reliability of a product and stability of a product. Therefore, efforts are needed to improve it.

SUMMARY

Accordingly, the present disclosure is to provide a flexible display device having a back cover for supporting a flexible display panel, thereby improving physical durability of the flexible display panel.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

In one aspect, a flexible display device having a first region, a second region, and a third region between the first region and the second region are defined, and capable of being bent with respect to a center axis extending along a first direction on the third region, comprises a flexible display panel; and a back cover disposed on a back surface of the flexible display panel and having a plurality of opening patterns provided in the third region, wherein the plurality of opening patterns include: opening patterns arranged in odd-numbered columns along the first direction; and opening patterns arranged in even-numbered columns along the first direction, wherein each of the opening patterns includes: a first portion having a width becoming smaller in a second direction intersecting with the first direction as the first portion progresses along the first direction; and a second portion extending from the first portion and having a width becoming greater in the second direction as the second portion progresses along the first direction, wherein the first portion of the opening pattern arranged in the odd-numbered columns is arranged to be adjacent to the second portion of the opening pattern arranged in the even-numbered columns along the second direction, and wherein the second portion of the opening pattern arranged in the odd-numbered columns is arranged to be adjacent to the first portion of the opening pattern arranged in the even-numbered columns along the second direction.

In another aspect, a flexible display device having a first region, a second region and a third region defined between the first region and the second region, and bendable with respect to a center axis extending along a first direction at the third region includes a bendable flexible display panel; and a bendable back cover disposed on a non-displaying side of the flexible display panel and having a plurality of first opening patterns in odd-numbered columns along the first direction, and a plurality of second opening patterns in even-numbered columns along the first direction at the third region, wherein the first and second opening patterns have first and second portions, each opening pattern has a contour having a shortest width at a location where the first and second portions meet to minimize tensile stress on the third region with regard to repetitive bending actions.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this disclosure, illustrate aspects of the disclosure and together with the description serve to explain the principles of the disclosure. In the drawings.

DETAILED DESCRIPTION OF THE ASPECTS

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. In describing various aspects, the same components may be described at the outset and may be omitted in other aspects.

The terms "first", "second", etc. may be used to describe various components, but the components are not limited by the terms. The terms are used only for the purpose of distinguishing one component from other components.

A flexible display device according to an aspect of the disclosure may be implemented based on a display device such as a liquid crystal display (LCD), a field emission display (FED), a plasma display panel (PDP), an organic light emitting diode display device (OLEDD), an electrophoresis display (EPD), a quantum dot display (QDD), or the like. Hereinafter, for convenience of explanation, a flexible display device including an organic light emitting diode (hereinafter, referred to as OLED) will be described as an example.

Figure 1:
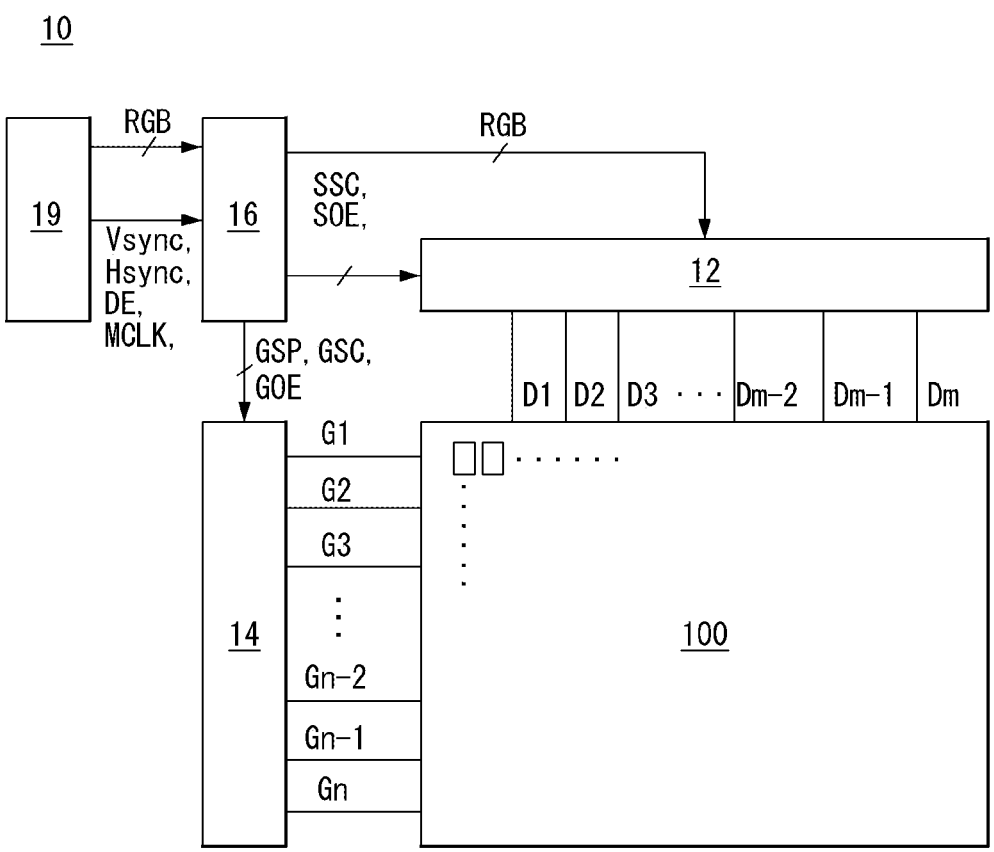
FIG. 1 is a schematic view of a flexible display device according to an aspect of the disclosure.
Figure 2:
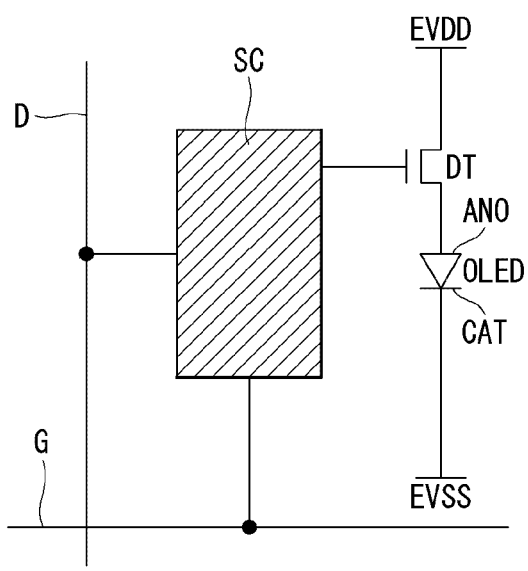
FIG. 2 is a schematic view of a pixel shown in FIG. 1.
Figure 3:
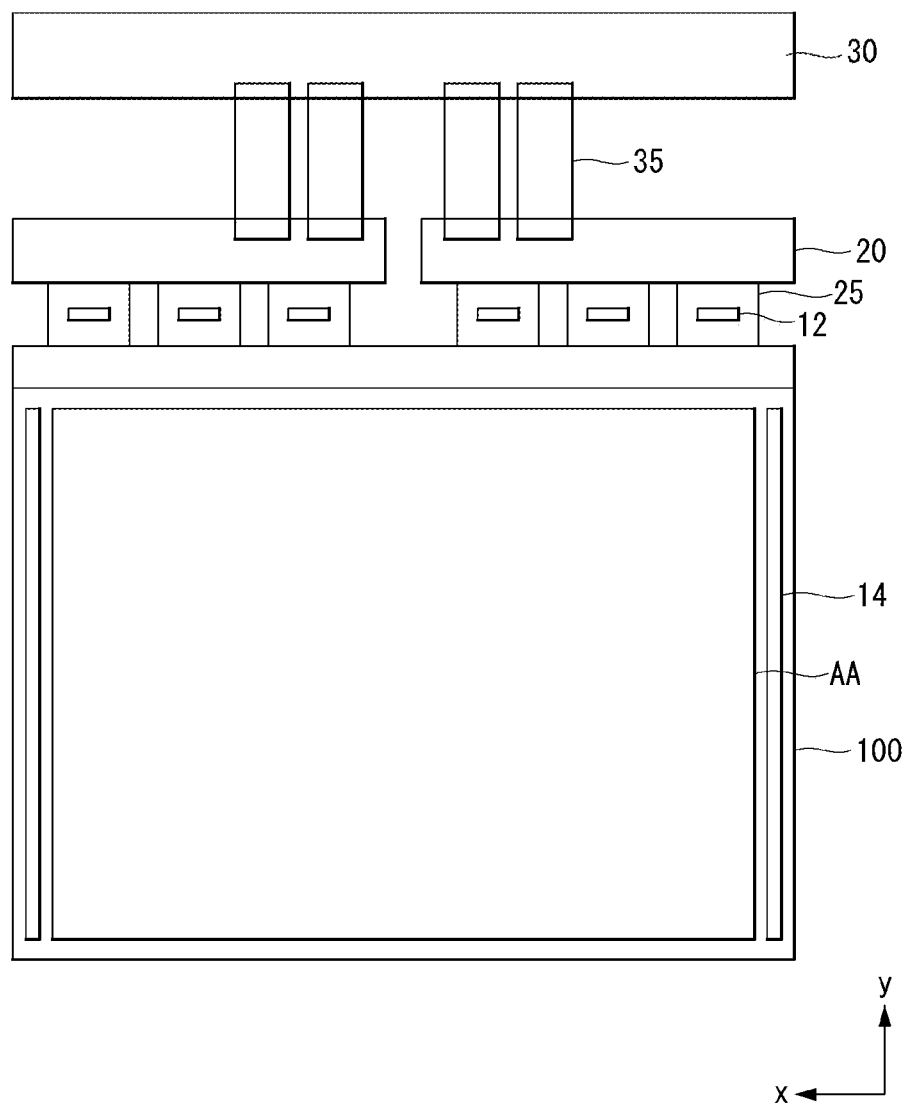
FIG. 3 is a view illustrating a structure of a modular flexible display panel.

FIG. 1 is a schematic view of a flexible display device according to an aspect of the disclosure. FIG. 2 is a schematic view of a pixel shown in FIG. 1. FIG. 3 is a view illustrating a structure of a modular flexible display panel.

Referring to FIG. 1, a flexible display device 10 according to an aspect of the disclosure includes a display driving circuit and a flexible display panel 100.

The display driving circuit includes a data driver 12, a gate driver 14, and a timing controller 16, and writes a video data voltage of an input image to pixels of the flexible display panel 100. The data driver 12 converts digital video data RGB input from the timing controller 16 into an analog gamma compensation voltage to generate a data voltage. The data voltage output from the data driver 12 is supplied to data lines D1 to Dm. The gate driver 14 sequentially supplies a gate signal synchronized with the data voltage to gate lines G1 to Gn to select the pixels of the flexible display panel 100 to which the data voltage is written.

The timing controller 16 receives a timing signal such as a vertical synchronizing signal Vsync, a horizontal synchronizing signal Hsync, a data enable signal DE and a main clock MCLK, and the like input from a host system 19, and synchronizes operation timing of the data driver 12 and the gate driver 14. Data timing control signal for controlling the data driver 12 includes a source sampling clock SSC, a source output enable signal SOE, and the like. Gate timing control signal for controlling the gate driver 14 includes a gate start pulse GSP, a gate shift clock GSC, a gate output enable signal GOE, and the like.

The host system 19 may be implemented as one of a television system, a set-top box, a navigation system, a DVD player, a Blu-ray player, a personal computer (PC), a home theater system, and a phone system. The host system 19 includes a system on chip (SoC) with an embedded scaler to convert the digital video data RGB of the input image into a format suitable for displaying on the flexible display panel 100. The host system 19 transmits the timing signals Vsync, Hsync, DE, and MCLK together with the digital video data RGB to the timing controller 16.

The flexible display panel 100 includes a plastic substrate including a pixel array. The plastic substrate may be formed of a material such as polyimide (PI), polyethylene terephthalate (PET), polyethylene naphthalate (PEN), polycarbonate (PC), polyethersulfone (PES), polyarylate (PAR), polysulfone (PSF) or cyclic olefin copolymer (COC), or the like. The pixel array includes pixels defined by the data lines (D1 to Dm, where m is a positive integer) and the gate lines (G1 to Gn, where n is a positive integer). Each of the pixels includes an OLED which is a self-light emitting element.

Referring to FIG. 2, in the flexible display panel 100, a plurality of data lines D and a plurality of gate lines G intersect, and pixels are arranged in a matrix form in each of the intersecting regions. Each of the pixels includes an OLED, a driving thin film transistor (hereinafter, referred to as TFT) DT for controlling an amount of current flowing through the OLED, and a programming unit SC for setting a gate-source voltage of the driving TFT DT.

The programming unit SC may include at least one switching TFT and at least one storage capacitor. The switching TFT is turned on in response to a gate signal from the gate line G to apply a data voltage from the data line D to one electrode of the storage capacitor. The driving TFT DT controls the amount of current supplied to the OLED depending on a magnitude of a voltage charged in the storage capacitor to control an amount of light emitted from the OLED. The amount of light emitted from the OLED is proportional to the amount of current supplied from the driving TFT DT. Each of the pixels is connected to a high potential power source EVDD and a low potential power source EVSS, and are supplied with a high potential power supply voltage and a low potential power supply voltage from a power generator (not shown). TFTs constituting a pixel may be implemented as a p-type or an n-type. In addition, a semiconductor layer of the TFTs constituting the pixel may include amorphous silicon, polysilicon, or an oxide. The OLED includes an anode electrode ANO, a cathode electrode CAT, and an organic compound layer interposed between the anode electrode ANO and the cathode electrode CAT. The anode electrode ANO is connected to the driving TFT DT.

Referring to FIG. 3, the flexible display panel 100 is electrically connected to the timing controller 16 in FIG. 1, the data driver 12, the gate driver 14, and the like (the host system 19 in FIG. 1 and the power generator are not shown), and is modularized.

The gate driver 14 may be formed on the flexible display panel 100 by a gate in panel (GIP) manner. That is, the gate driver 14 may be formed in a GIP manner on left, right, or both left and right sides of a display area AA in order to easily wind and unwind the flexible display panel 100. However, the aspect of the disclosure is not limited thereto.

A data printed circuit board (PCB) 20 is electrically connected to the flexible display panel 100 through a first connection member 25. The first connection member 25 may be a chip on film (COF) on which the data driver 12 is mounted, but is not limited thereto. For example, the first connection member 25 may be implemented by a tape carrier package (TCP) manner to electrically connect the data PCB 20 and the flexible display panel 100.

The data PCB 20 is connected to a control board 30 through a second connection member 35. The second connection members 35 may be plural. The timing controller 16 and the like are mounted on the control board 30. The second connection member 35 may be a flexible flat cable (FFC), but is not limited thereto. The control board 30 may be connected to the host system 19 in FIG. 1, the power generator, and the like through a connection cable.

Figure 4A:
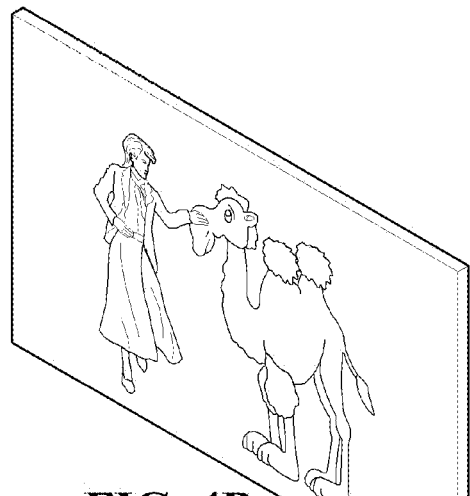
FIGS. 4A to 4C are views illustrating examples of use of a flexible display device according to an aspect of the disclosure.
Figure 4B:
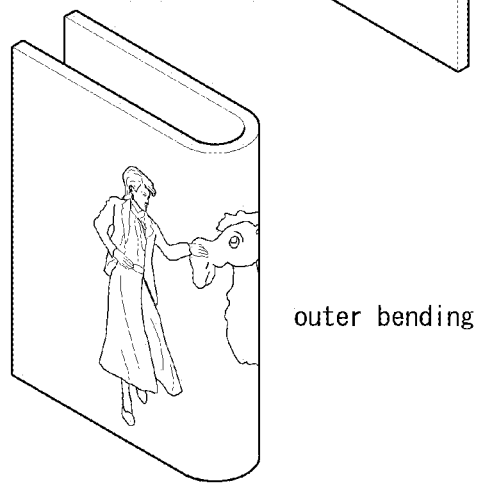
Figure 4C:
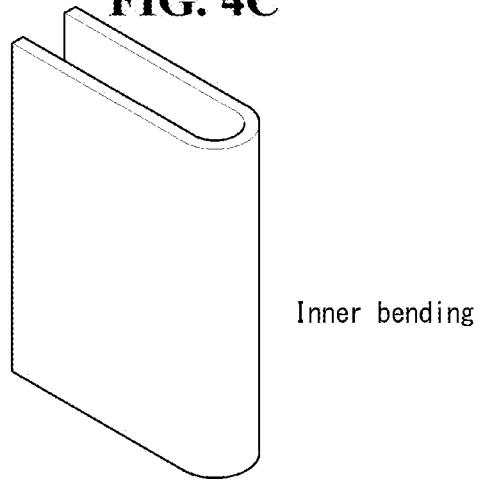

FIGS. 4A to 4C are views illustrating examples of use of a flexible display device according to an aspect of the disclosure.

Referring to FIG. 4, a flexible display panel 100 includes a display area in which an input image is implemented. A user can recognize information output from the flexible display panel 100 through the display area. A front surface of the flexible display panel 100 refers to one surface of the flexible display panel 100 in which the display area is defined. Conversely, a back surface of the flexible display panel 100 refers to one surface of the flexible display panel 100 in a direction opposite to the front surface thereof, in which the user can not recognize the display area.

The flexible display panel 100 may be bent. That is, the flexible display panel 100 may be easily and repeatedly subjected to bending (or folding, rolling, winding) operations or unbending (or unfolding, unrolling, unwinding) operations by being given a predetermined flexibility. The flexible display panel 100 may be bent (inner bending) in a front surface direction of the flexible display panel 100 and may be bent (outer bending) in a back surface direction of the flexible display panel 100. Hereinafter, for convenience of explanation, an instance of that the flexible display panel 100 is bent in the back surface direction will be described as an example, unless otherwise specified.

FIGS. 5A to 9 are views illustrating a structure of a flexible display device according to an aspect of the disclosure.

Figure 5A:
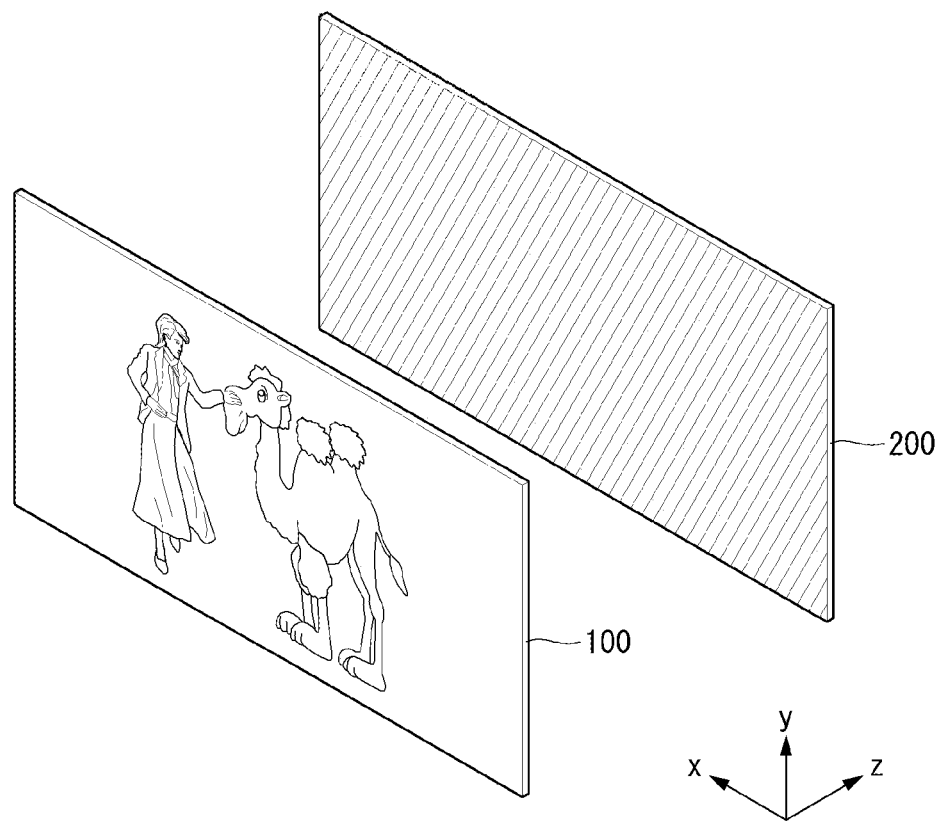
FIGS. 5A to 9 are views illustrating a structure of a flexible display device according to an aspect of the disclosure.
Figure 5B:
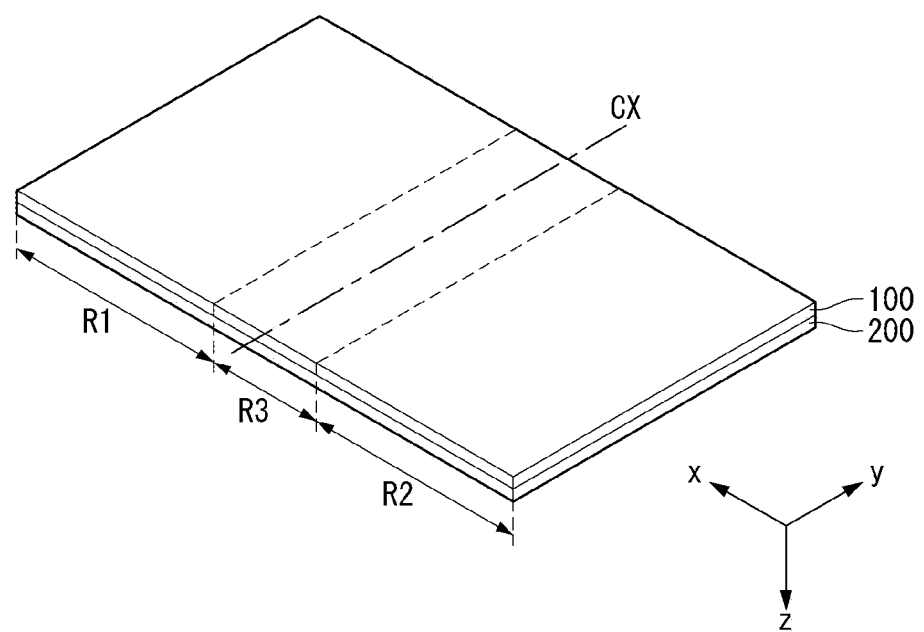

Referring to FIGS. 5A and 5B, the flexible display device according to an aspect of the disclosure includes a flexible display panel 100 and a back cover 200 provided on a back surface of the flexible display panel 100.

The flexible display panel 100 may be bent or unbent to maintain a first state and a second state. The first state may refer to the unbent state (or flat state) of the flexible display panel 100. The second state may refer to the bent state of the flexible display panel 100. For a state change from the first state to the second state, the flexible display panel 100 may be bent with respect to a virtual center axis CX extending along a first direction (for example, a y-axis direction). The virtual center axis CX may be a center of rotation. The first direction may be defined as a width direction of the flexible display panel 100. A second direction (for example, an x-axis direction) may be defined as a longitudinal direction of the flexible display panel 100. A third direction (for example, a z-axis direction) may be defined as a thickness direction of the flexible display panel 100.

The state change of the flexible display panel 100 may be caused by a physical external force directly provided by a user. For example, the user can grasp one end of the flexible display panel 100 and apply force to the flexible display panel 100 to implement the state change of the flexible display panel 100. Alternatively, the state change of the flexible display panel 100 may be controlled through a controller in response to a predetermined specific signal. That is, the state change of the flexible display panel 100 can be controlled by a selected driving device, a selected driving circuit, and the like.

When the flexible display device according to an aspect of the disclosure is implemented by the outer bending manner, the display area of the flexible display panel 100 is exposed to the outside regardless of the state change. That is, even during the first state, the second state, and the state change continuation, the user can recognize the display area of the flexible display panel 100 and selectively receive necessary information.

When the flexible display device according to an aspect of the disclosure is implemented by the inner bending manner, the first state may be a state in which the user can recognize the display area of the flexible display panel 100 from the outside and be provided with necessary information, the second state may be a state in which the display area of the flexible display panel 100 is not exposed to the outside and the user can not recognize the display area.

As an example, the first state may be a state in which the display device is turned on so that an input image is implemented. The second state may be a state in which the display device is turned off so that the input image is not implemented. Various events including ON/OFF of the flexible display panel 100 can be controlled through a controller in response to a predetermined specific signal supplied through a user input unit, a sensor, or the like.

The user input unit may include a touch key for recognizing a conductor including a user's finger, or a push key or a mechanical key for recognizing a physical pressure. The sensor may include a proximity sensor, an illumination sensor, a touch sensor, a finger scan sensor, or the like capable of sensing at least one of environment information and user information.

The back cover 200 supports a lower surface of the flexible display panel 100 and reinforces rigidity of the flexible display panel 100. The aspect of the disclosure further improves physical durability of the flexible display panel 100 by further including the back cover 200. The back cover 200 may include a lightweight and high-strength material. For example, the back cover 200 may be formed of one of glass fiber reinforced plastics (GFRP), carbon fiber reinforced plastics (CFRP), aluminum, or plastic. However, the aspect of the disclosure is not limited thereto. Size and shape of the back cover 200 can be appropriately selected within a range that does not restrain or restrict a free deformation of the flexible display panel 100.

The back cover 200 is fixed to the back surface of the flexible display panel 100. That is, the back cover 200 and the flexible display panel 100 are fixed so that mutual movement is restrained and restricted. The back cover 200 may have a planar shape and an area corresponding to the flexible display panel 100. The planar shape and area of the back cover 200 can be selected within a range that does not restrain or restrict the free deformation of the flexible display panel 100.

The flexible display device according to an aspect of the disclosure includes a first region R1, a second region R2, and a third region R3. The first region R1 and the second region R2 are regions in which the flexible display panel 100 and the back cover 200 remain flat regardless of the state change. The third region R3 may be defined between the first region R1 and the second region R2. The third region R3 is a region in which the flexible display panel 100 and the back cover 200 are bent or unbent in response to the state change. The flexible display panel 100 and the back cover 200 of the third region R3 maintain a flat state in the first state and a bent state in the second state. The third region R3 of the flexible display panel 100 is supported by the back cover 200 so that it can maintain a constant curvature in the second state.

At least one of the first region R1, the second region R2, and the third region R3 may implement a different event from the other. For example, different images may be implemented in the display area of the first region R1 and the display area of the second region R2. As another example, either the display area of the first region R1 or the display area of the second region R2 may be in an ON state and the other may be in an OFF state.

Although the flexible display device in which the first region R1, the second region R2, and the third region R3 are sequentially defined is shown as an example in the drawing, the aspect of the disclosure is not limited thereto. For example, in a flexible display device according to a preferred aspect of the disclosure, a unit region including the first region R1, the second region R2, and the third region R3 may be defined at least n (n is an integer of 1 or more) times alternately.

The third region R3 of the back cover 200 may be deformed due to concentration of stress when the state of the flexible display panel 100 is changed. In order to solve this problem, it is possible to consider a method including a material having high rigidity, but in this instance, it is difficult to secure flexibility. Accordingly, in order to reduce the stress provided to the third region R3 of the back cover 200 when the state of the flexible display panel 100 is changed, the aspect of the disclosure forms an opening pattern OP having a predetermined opening area in the third region R3. Of course, although a thickness of the back cover 200 can be reduced to reduce the stress, in this instance, it is difficult to maintain smoothness (or flatness) of the flexible display panel 100 in the first state, and it is difficult to secure a required predetermined rigidity.

Figure 6:
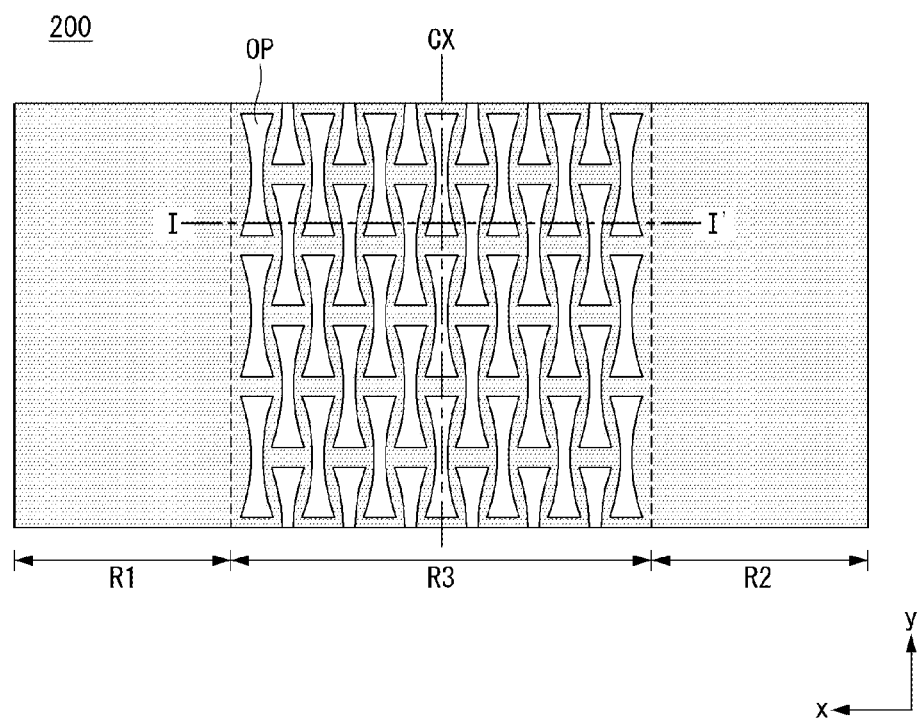
Figure 7A:
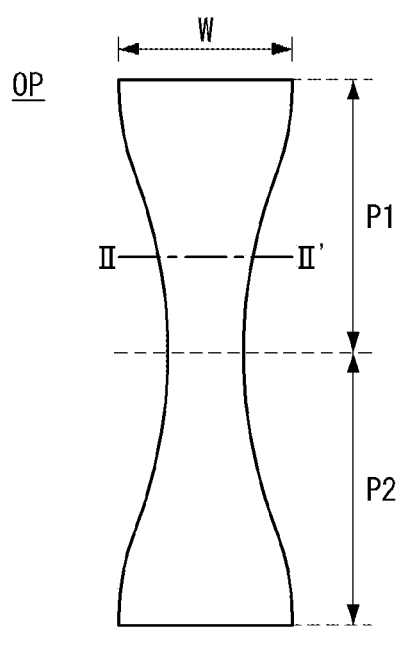
Figure 7B:
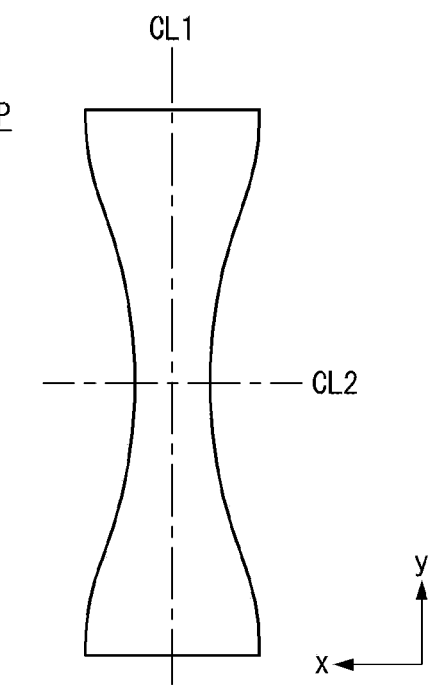

Referring to FIGS. 6 and 7, the third region R3 of the back cover 200 includes a plurality of opening patterns OP. Opening areas of the opening patterns OP can be appropriately selected in consideration of securing a predetermined rigidity for supporting the flexible display panel 100 and a degree of stress that can be concentrated in the third region R3 of the back cover 200. That is, when the opening areas of the opening patterns OP are relatively great, it is difficult to secure the predetermined rigidity for supporting the flexible display panel 100. On the other hand, when the opening areas of the opening patterns OP are relatively small, stress is concentrated on the third region R3 of the back cover 200, plastic deformation or breakage may occur in a connection portion between adjacent opening patterns OP. The aspect of the disclosure discloses an opening pattern OP having a new shape that can effectively reduce the stress that can be concentrated on the third region R3 without widening the opening areas excessively, and its arrangement relationship.

The opening pattern OP includes a first portion P1 and a second portion P2 extending along the first direction. As the first portion P1 progresses along the first direction, a width in the second direction becomes smaller. As shown in the figure, the width of the first portion P1 may vary non-linearly (or in a curve form) along the first direction. Alternatively, the width of the first portion P1 may vary linearly (or in a straight line form) along the first direction.

As the second portion P2 progresses along the first direction, a width in the second direction becomes greater. As shown in the figure, the width of the second portion P2 may vary non-linearly (or in a curve form) along the first direction. Alternatively, the width of the second portion P2 may vary linearly (or in a straight line form) along the first direction.

The first portion P1 and the second portion P2 may be implemented such that their widths vary in either non-linear form or linear form. The width of either one of the first portion P1 and the second portion P2 may vary non-linearly and the other may vary linearly. A length of the first portion P1 in the first direction may be equal to or different from a length of the second portion P2 in the first direction.

Since a connecting portion of the first portion P1 and the second portion P2 has a narrower width than the other portions, the opening pattern OP may be referred to as a large mortar shape, a double-headed drum shape, or a sandglass shape. Assuming a virtual first center line CL1 crossing a center of the opening pattern OP along the first direction, a pattern on the left side and a pattern on the right side based on the first center line CL1 may have a line symmetry with respect to the first center line CL1. Assuming a virtual second center line CL2 crossing a center of the opening pattern OP along the second direction, a pattern on the upper side and a pattern on the lower side based on the second center line CL2 may have a line symmetry with respect to the second center line CL2.

Figure 8:
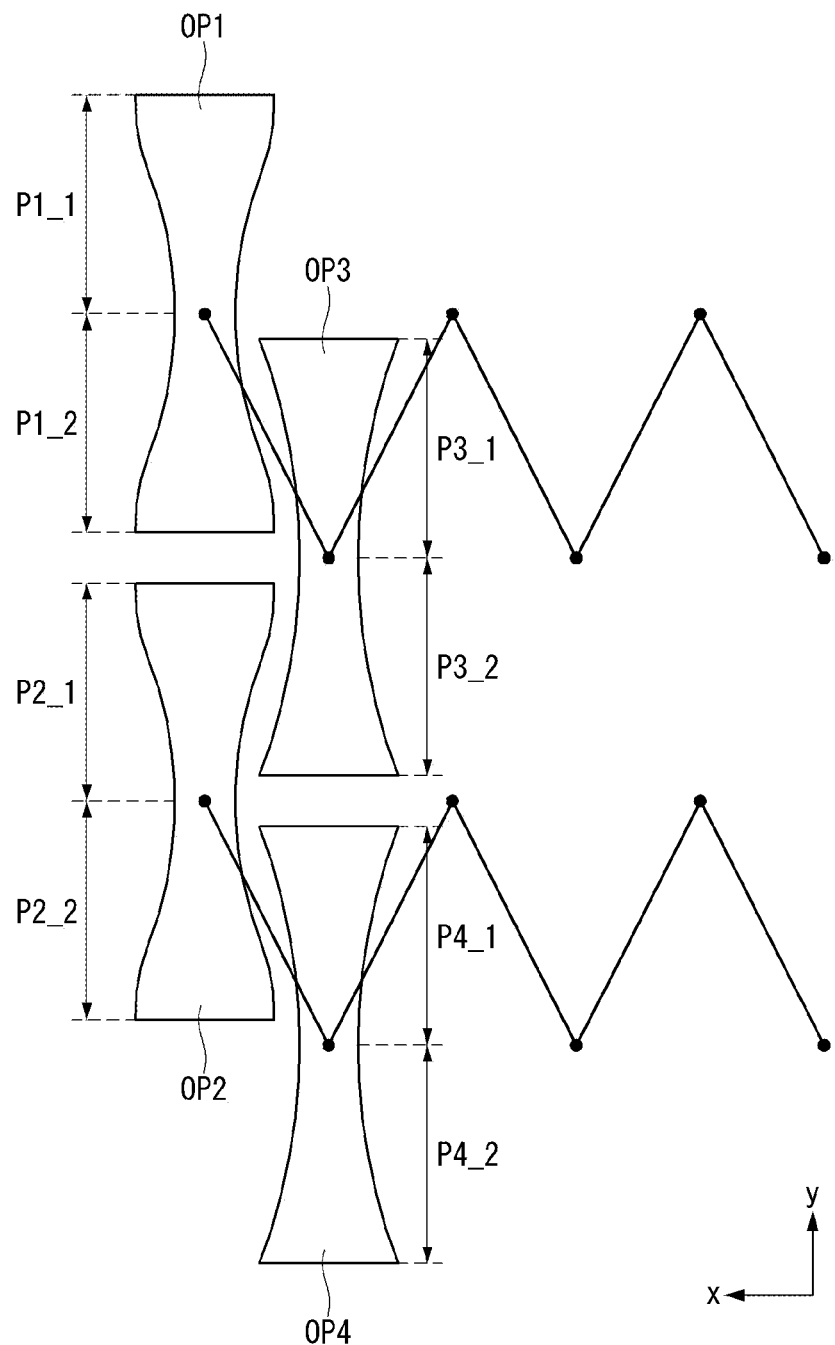

Referring further to FIG. 8, the third region R3 of the back cover 200 includes odd-numbered columns in which opening patterns OP are arranged along the first direction and even-numbered columns in which the opening patterns OP are arranged along the first direction. For example, the third region R3 of the back cover 200 includes a first opening pattern OP1 and a second opening pattern OP2 arranged in the odd-numbered columns and spaced a predetermined interval apart along the first direction. The third region R3 of the back cover 200 includes a third opening pattern OP3 and a fourth opening pattern OP4 arranged in the even-numbered columns and spaced a predetermined interval apart along the first direction. The first opening pattern OP1 and the third opening pattern OP3 are spaced a predetermined interval apart along the second direction. The second opening pattern OP2 and the third opening pattern OP3 are spaced a predetermined interval apart along the second direction. The second opening pattern OP2 and the fourth opening pattern OP4 are spaced a predetermined interval apart along the second direction. The first opening pattern OP1, the second opening pattern OP2, the third opening pattern OP3 and the fourth opening pattern OP4 each includes a first portion P1_1, P2_1, P3_1 and P4_1 and a second portion P1_2, P2_2, P3_2 and P4_2.

The second portion P1_2 of the first opening pattern OP1 is arranged to be adjacent to the first portion P3_1 of the third opening pattern OP3 along the second direction at a predetermined interval. The first portion P2_1 of the second opening pattern OP2 is arranged to be adjacent to the second portion P3_2 of the third opening pattern OP3 along the second direction at a predetermined interval. The second portion P2_2 of the second opening pattern OP2 is arranged to be adjacent to the first portion P4_1 of the fourth opening pattern OP4 along the second direction at a predetermined interval. The first portion P1 and the second portion P2 of the opening patterns OP are arranged alternately along the second direction.

That is, the first portion P1 of the opening patterns OP located in the odd-numbered column is arranged to be adjacent to the second portion P2 of the opening patterns OP located in the even-numbered column along the second direction. The second portion P2 of the opening patterns OP located in the odd-numbered column is arranged to be adjacent to the first portion P1 of the opening patterns OP located in the even-numbered column along the second direction. Accordingly, when viewed on a plane defined by the first direction and the second direction, the opening patterns OP located in the odd-numbered column and the opening patterns OP located in the even-numbered column may be arranged in a zigzag shape along the second direction.

Figure 9:
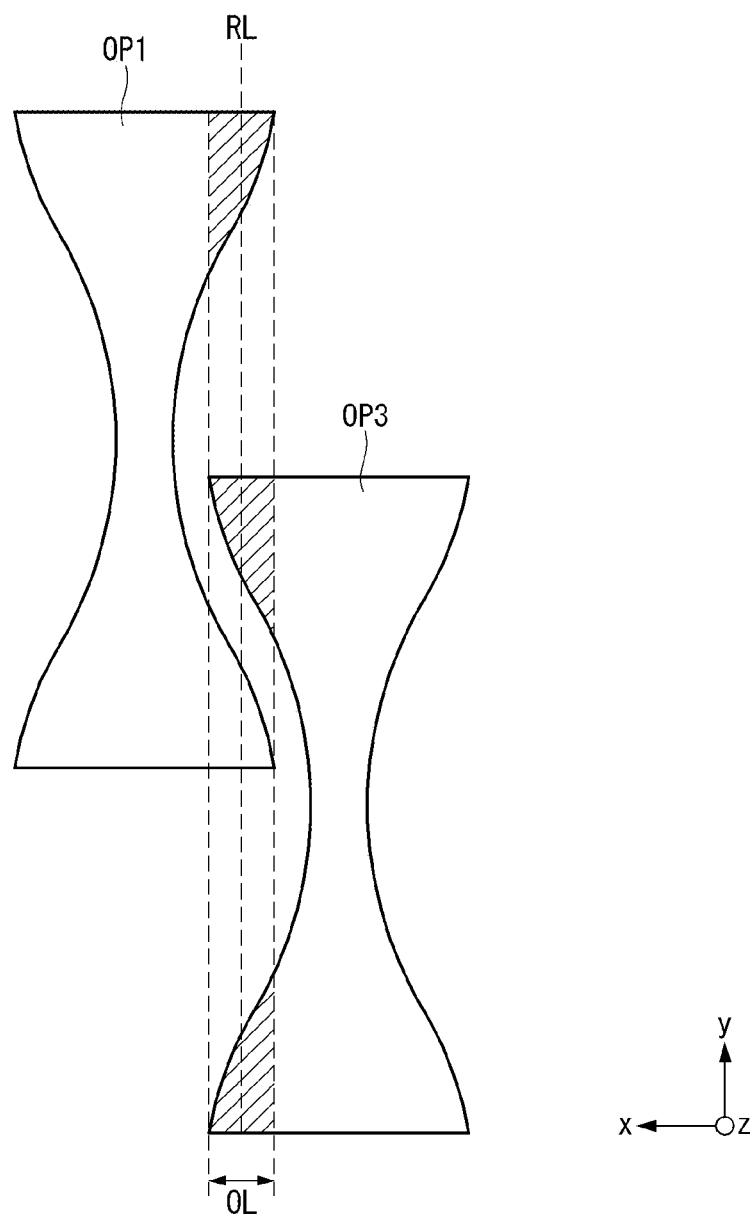

Referring to FIG. 9, at least one virtual reference line RL extending in parallel in the first direction can simultaneously overlap at a boundary of the first opening pattern OP1 and a boundary of the third opening pattern OP3. The boundary of the opening pattern OP determines a shape of the opening pattern OP. In other words, a part of a boundary of the first opening pattern OP1 and a part of a boundary of the third opening pattern OP3 can simultaneously overlap on one reference line RL extending in parallel along the first direction. Here, the first opening pattern OP1 and the third opening pattern OP3 are adjacent to each other along the second direction. As a result, when viewed on a plane defined by the second direction and the third direction, a region OL in which the first opening pattern OP1 and the third opening pattern OP3 overlap each other in the second direction may occur. That is, the opening patterns OP located in the odd-numbered column and the opening patterns OP located in the even-numbered column adjacent to the odd-numbered column may be arranged so that a part of their boundaries can overlap each other on one reference line RL extending in parallel along the first direction.

Figure 10A:
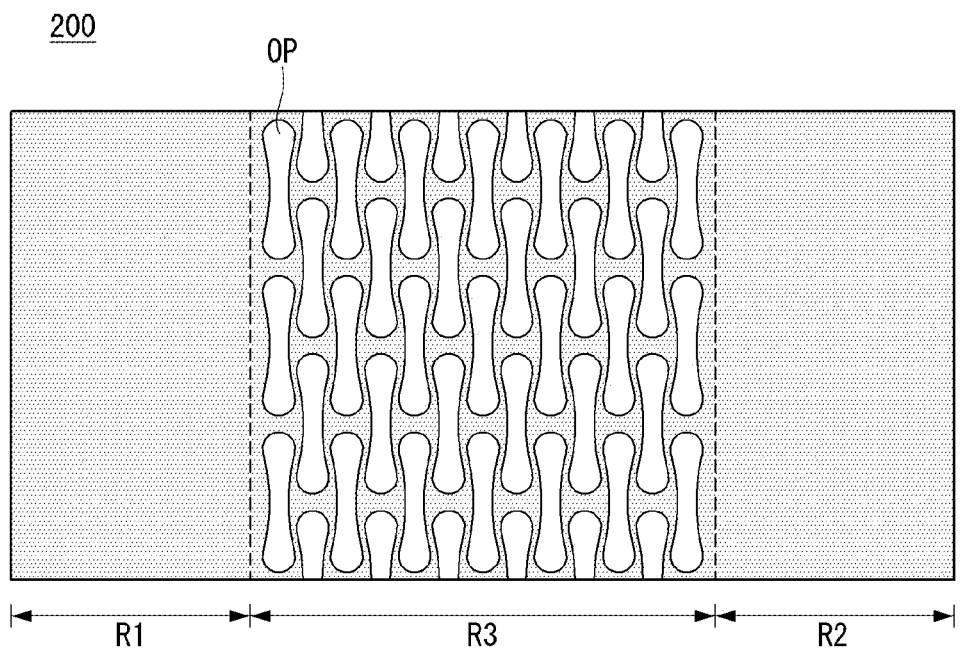
FIGS. 10A and 10B are views illustrating another shape of an opening pattern.
Figure 10B:
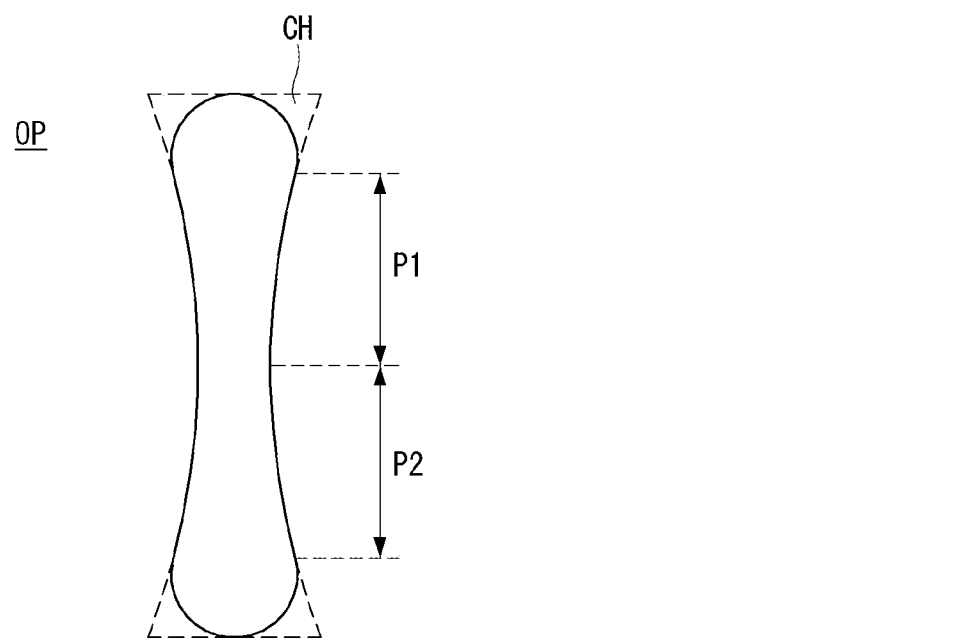

FIGS. 10A and 10B are a view illustrating another shape of an opening pattern.

Referring to FIG. 10, an edge of at least one of upper and lower ends of an opening pattern OP may be chamfered to have a curved shape. The upper and lower ends respectively refer to both ends in the first direction when viewed on a plane defined by the first direction and the second direction.

Also in this instance, the opening pattern OP includes a first portion P1 and a second portion P2 extending along the first direction. As the first portion P1 progresses along the first direction, a width in the second direction becomes smaller. As shown in the figure, the width of the first portion P1 may vary non-linearly (or in a curve form) along the first direction. Alternatively, the width of the first portion P1 may vary linearly (or in a straight line form) along the first direction.

As the second portion P2 progresses along the first direction, a width in the second direction becomes greater. As shown in the figure, the width of the second portion P2 may vary non-linearly (or in a curve form) along the first direction. Alternatively, the width of the second portion P2 may vary linearly (or in a straight line form) along the first direction.

FIGS. 11A to 13 are views illustrating an effect of the disclosure through comparative experiments.

Figure 11A:
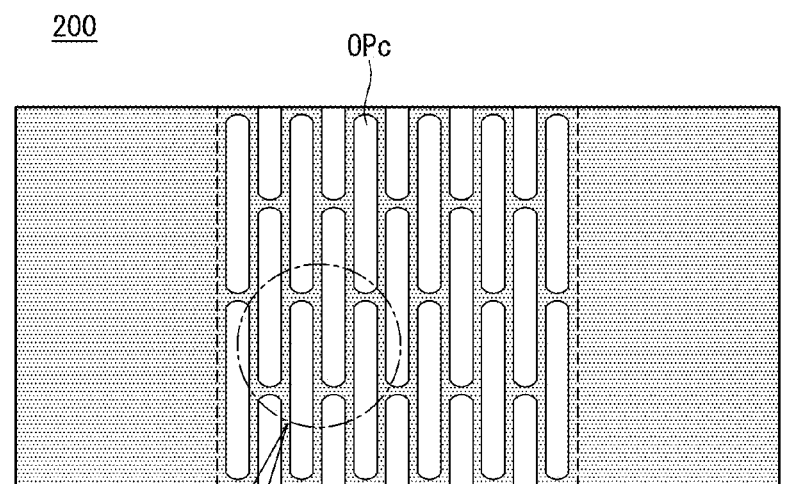
FIGS. 11A to 13 are views illustrating an effect of the disclosure through comparative experiments.

FIG. 11A illustrates an opening pattern OPc according to a comparative example 1. The opening pattern OPc according to the comparative example 1 has a constant width. When the flexible display panel 100 changes from the first state to the second state, each of first connection portions LNc1 is under tensile stress. The first connection portion LNc1 refers to a pattern remaining between adjacent opening patterns OPc in the first direction. Therefore, plastic deformation and breakage are likely to occur in the first connection portion LNc1 because stress provided to the third region R3 of the back cover 200 is concentrated on the first connection portion LNc1 depending on a state change.

Figure 11B:
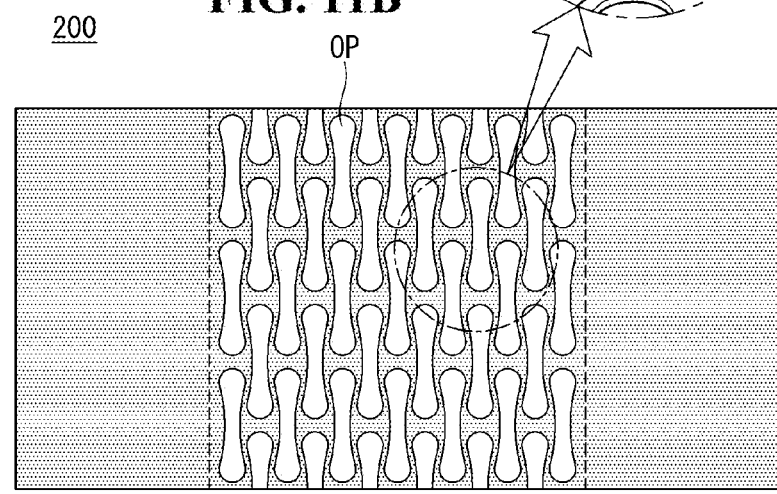

FIG. 11B illustrates an opening pattern OP according to an aspect of the present disclosure. The opening pattern OP according to an aspect includes a first portion and a second portion having a variable width. When the flexible display panel changes from the first state to the second state, a first_1 connection portion LN1_1 and a first_2 connection portion LN1_2 connected to both sides of a second connection portion LN2 are shifted in different directions without being in position. At the same time, the second connection portion LN2 is distorted. The second connection portion LN2 refers to a pattern remaining between adjacent opening patterns OP in the second direction. The first_1 connection portion LN1_1 and the first_2 connection portion LN1_2 refer to a pattern remaining between adjacent opening patterns OP in the first direction. Therefore, the aspect of the disclosure can minimize plastic deformation and fracture of the first_1 connection portion LN1_1 and the first_2 connection portion LN1_2 because stress provided to the third region R3 of the back cover 200 is not concentrated on the first_1 and the first_2 connection portion LN1_1 and LN1_2 and can be dispersed to the second connection portion LN2.

Figure 12:
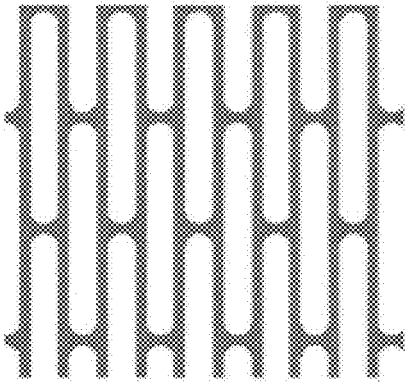

FIG. 12 illustrates simulation results of comparative example 1 and an aspect of the present disclosure which are tested under the same conditions except for shapes of opening patterns OPc and OP. As a result, when a state changes, it was shown seen that stress of 1.49 GPa acts on the third region R3 of the back cover 200 in the comparative example 1, and stress of 0.83 GPa acts on the third region R3 of the back cover 200 in the aspect 1. As shown from the simulation results, the stress acting on the third region R3 of the back cover 200 can be reduced in an aspect of the disclosure.

Figure 13:
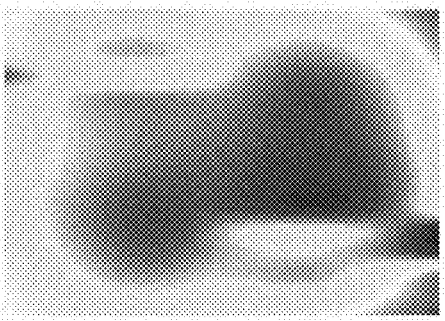

FIG. 13 illustrates a result of a reliability test in a state of high temperature reliability in a state in which the back cover 200 according to comparative example 1 and the back cover 200 according to an aspect of the disclosure are bent. The reliability test is conducted at a high temperature of 60° C. for 96 hours. As a result, it was shown that the back cover 200 according to the comparative example 1 suffers deformation in the third region R3 after the reliability test, but the back cover 200 according to an aspect of the disclosure does not suffer deformation even after the reliability test.

FIG. 14 is views illustrating a flexible display device according to an aspect of the present disclosure. FIG. 14 is a cross-sectional view taken along line I-I' of FIG. 6.

Referring to FIG. 14, the flexible display device according to an aspect of the present disclosure may further include a step compensation layer 300. The step compensation layer 300 is provided to fill opening patterns OP formed in a back cover 200 to compensate a step formed by the opening patterns OP. An aspect of the present disclosure further includes the step compensation layer 300 filling the opening patterns OP so that a surface to be adhered to a back surface of a flexible display panel 100 can have a flat surface state. Accordingly, an aspect of the disclosure can minimize a sense of difference that a user can feel due to existence of the step of the opening patterns OP formed in the back cover 200.

More specifically, when the step compensation layer 300 is not provided, since the opening patterns OP of the back cover 200 are disposed immediately below the thin flexible display panel 100, the user can recognize the opening patterns OP of the back cover 200 at an upper portion of the flexible display panel 100. For example, the user can touch or slide on a front surface of the flexible display panel 100 using a finger, a stylus pen, or the like. In this instance, the step of the opening patterns OP formed in the back cover 200 can be recognized by the user through the finger. In order to prevent this, the aspect of the disclosure may further include the step compensation layer 300 capable of filling the opening patterns OP of the back cover 200.

Further, since the back cover 200 is generally adhered to the flexible display panel 100 through an adhesive such as pressure sensitive adhesive (PSA), when the back cover 200 having the opening patterns OP is directly disposed on the back surface of the flexible display panel 100, the adhesive may flow out through the opening patterns OP. The aspect of the disclosure further includes the step compensation layer 300, thereby preventing leakage of the adhesive.

Figure 14A:
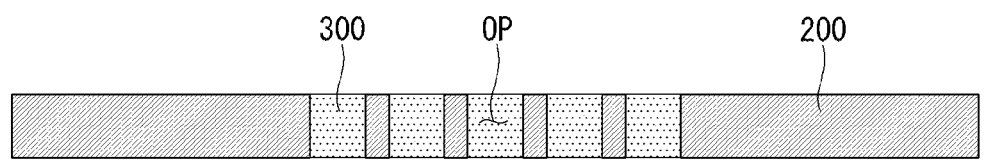
FIGS. 14A to 14D are views illustrating a flexible display device according to an aspect of the disclosure.

Referring to FIG. 14A, the step compensation layer 300 may be provided to fill only the opening patterns OP of the back cover 200. The step compensation layer 300 may include a material such as silicon, but is not limited thereto.

Figure 14B:
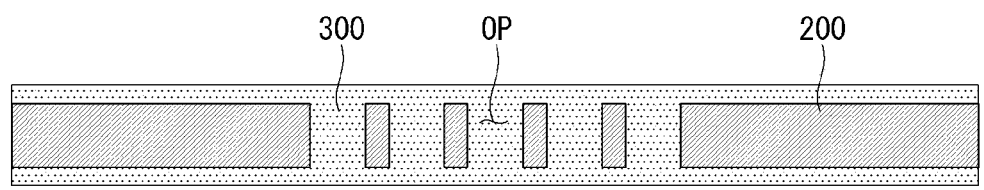

Referring to FIG. 14B, the step compensation layer 300 may be provided to cover a front surface and a back surface of the back cover 200 while filling the opening patterns OP of the back cover 200. By interposing the step compensation layer 300 having a smooth upper surface between the flexible display panel 100 and the back cover 200, it is possible to minimize a sense of difference that the user can feel.

Figure 14C:
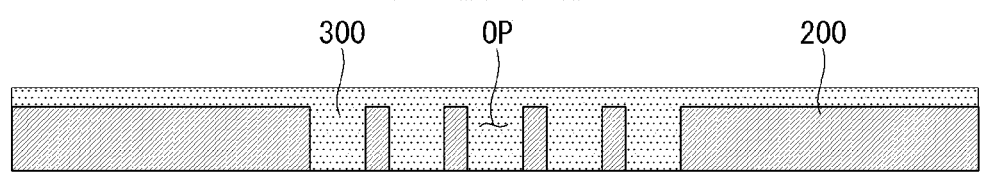

Referring to FIG. 14C, the step compensation layer 300 may be provided to cover the front surface of the back cover 200 while filling the opening patterns OP of the back cover 200. Since it has a relatively thin thickness compared with the structure of FIG. 14B, it is advantageous in securing flexibility.

Figure 14D:
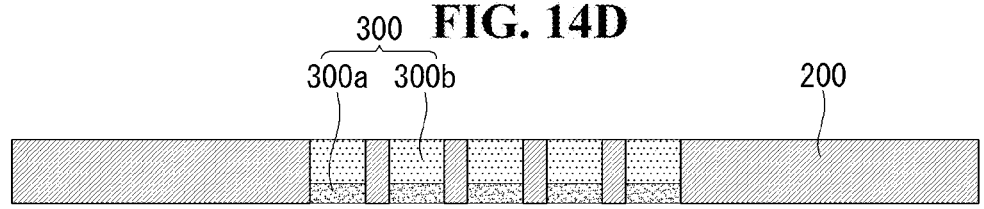
Figure 14D:
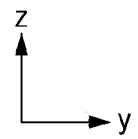

Referring to FIG. 14D, the step compensation layer 300 may be formed of one or more multi-layers 300a and 300b including different materials. When the material forming the step compensation layer 300 has a relatively low modulus, restoration speed (or resilience speed) corresponding to a state change can be slowed down, and when the material forming the step compensation layer 300 has a relatively high modulus, plastic deformation may occur in the material at the time of the state change. Accordingly, the step compensation layer 300 has a multilayer structure 300a, 300b in which materials having different modulus are stacked, thereby solving the above-described problem.

FIGS. 15A to 17 are views illustrating a flexible display device according to another aspect of the present disclosure. FIGS. 15A to 17 are a cross-sectional view taken along line II-II' of FIG. 7.

Figure 15A:
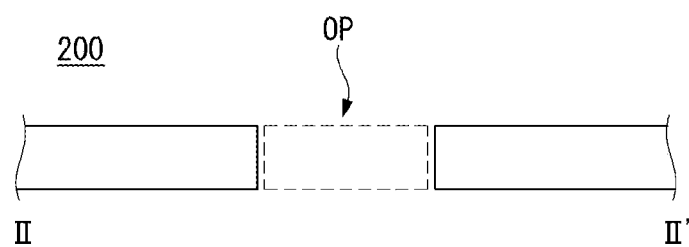
FIGS. 15A to 17 are views illustrating a flexible display device according to another aspect of the disclosure.
Figure 15B:
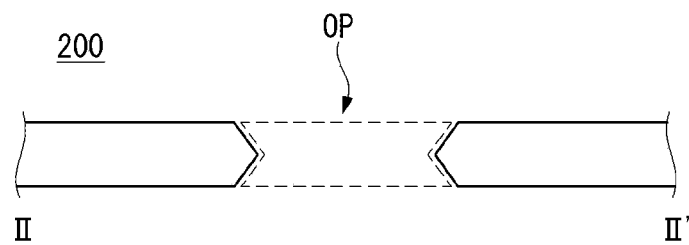

Referring to FIGS. 15A and 15B, an opening pattern OP formed in a back cover 200 may have various cross-sectional shapes. A cross-sectional shape of the opening pattern OP may be various planar shapes including a rectangle, a square, a trapezoid, and the like.

Figure 16A:
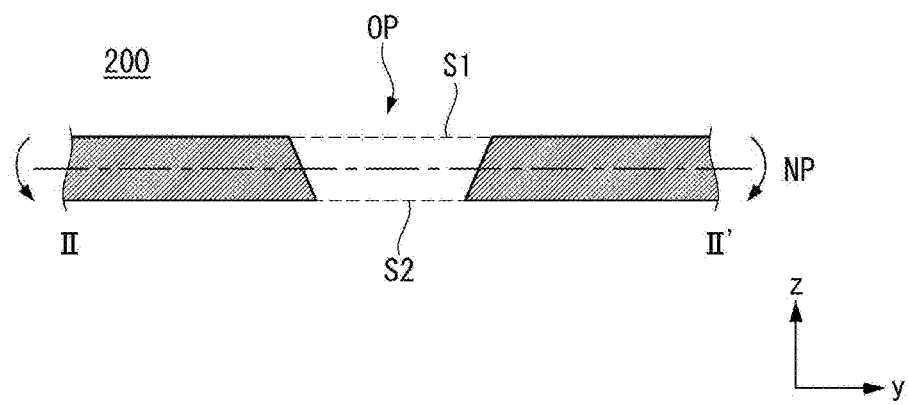

Referring to FIG. 16A, the cross-sectional shape of the opening pattern OP has a trapezoidal shape, and when a state changes, an opening area of a first surface S1 on which tensile stress acts may be relatively increased, and an opening area of a second surface S2 on which compressive stress acts may be relatively decreased. That is, a neutral plane NP located in the back cover 200 is interposed, and depending on a bending direction, tensile stress acts on either an upper portion or a lower portion of the neutral plane NP and compressive stress acts on the other. Materials tend to be more vulnerable to tensile stress than compressive stress. Therefore, the aspect of the present disclosure implements an opening area of one of the first surface S1 and the second surface S2 on which tensile stress act as a relatively large area so that the aspect of the disclosure can reduce the stress acting on the third region R3 of the back cover 200.

Figure 16B:
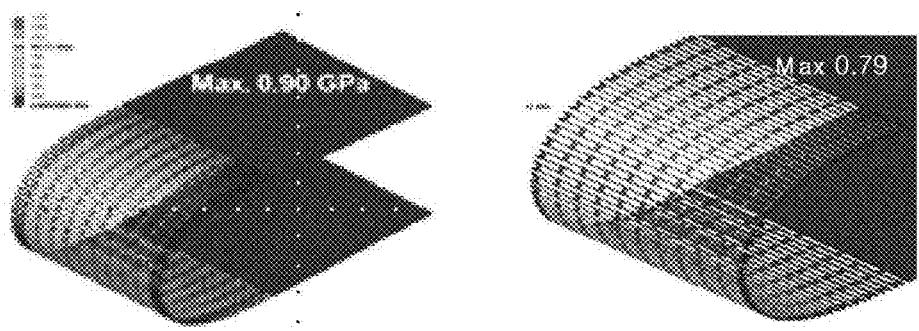

FIG. 16B is a simulation result of an experiment under the same conditions except for a cross-sectional shape of an opening pattern OP. Comparative example 2 shows a simulation result when the cross-sectional shape of the opening pattern OP is rectangular. Another aspect of the present disclosure shows a simulation result when the cross-sectional shape of the opening pattern OP is a trapezoidal shape, and an opening area of a surface on which tensile stress act is relatively increased.

As a result, it was shown that stress of 0.90 GPa acts on the third region R3 of the back cover 200 in the comparative example 2, and stress of 0.79 GPa acts on the third region R3 of the back cover 200 in another aspect of the present disclosure. As shown from the simulation result, the stress acting on the third region R3 of the back cover 200 can be reduced in another aspect of the present disclosure.

Figure 17:
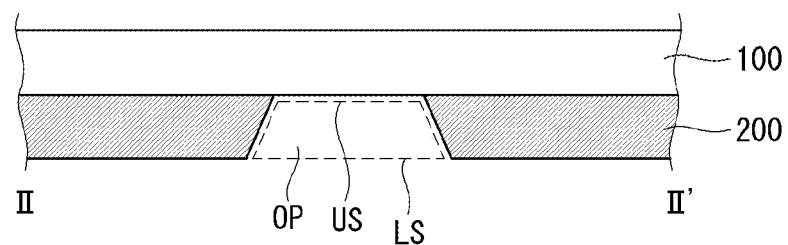

Referring to FIG. 17, a cross-sectional shape of an opening pattern OP may be a trapezoid shape in which a length of an upper side US is shorter than a length of a lower side LS. In this instance, since an opening size on surface to be adhered to the flexible display panel 100 can be reduced, it is possible to minimize a sense of difference that a user can feel.

The flexible display device according to an aspect of the disclosure includes a back cover for supporting a flexible display panel. Accordingly, the aspect of the disclosure can reinforce rigidity of the flexible display panel, thereby improving physical durability of the flexible display panel.

The aspect of the disclosure forms a new opening pattern on the back cover, so that stress that can be concentrated on a bending region of the back cover can be alleviated or dispersed and it is possible to secure the flexibility of the back cover when a state of the flexible display panel changes.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flexible display device having a first region, a second region, and a third region defined between the first region and the second region and bendable with respect to a center axis extending along a first direction on the third region, comprising:
- a flexible display panel; and
- a back cover disposed on a non-displaying side of the flexible display panel and having a plurality of opening patterns provided in the third region,
- wherein the plurality of opening patterns include:
- a plurality of first opening patterns arranged in odd-numbered columns along the first direction; and
- a plurality of second opening patterns arranged in even-numbered columns along the first direction,
- wherein each of the opening patterns includes:
- a first portion having a width becoming smaller in a second direction as the first portion progresses along the first direction and the second direction vertically intersecting the first direction; and
- a second portion extending from the first portion and having a width becoming greater in the second direction as the second portion progresses along the first direction,
- wherein the first portion of the first opening patterns adjacent to the second portion of the second opening patterns along the second direction, and
- wherein the second portion of the first opening patterns arranged in the odd-numbered columns adjacent to the first portion of the second opening patterns.

2. The flexible display device of claim 1, wherein the first opening patterns and the second opening patterns partially overlap each other with respect to at least one reference line extending in parallel along the first direction.

3. The flexible display device of claim 1, wherein the first and second opening patterns have a symmetrical shape with respect to a first center line crossing a center of the first and second opening patterns along the first direction.

4. The flexible display device of claim 1, wherein the first and second opening patterns have a symmetrical shape with respect to a second center line crossing a center of the first and second opening patterns along the second direction.

5. The flexible display device of claim 1, wherein at least one of the width of the first portion and the width of the second portion vary non-linearly along the first direction.

6. The flexible display device of claim 1, wherein a cross-sectional shape of the first and second opening patterns has a trapezoidal shape.

7. The flexible display device of claim 1, further comprising a step compensation layer filling the first and second opening patterns.

8. The flexible display device of claim 7, wherein the step compensation layer covers a front surface of the back cover.

9. The flexible display device of claim 7, wherein the step compensation layer includes a multi-layer in which layers with different modulus are stacked.

10. The flexible display device of claim 1, wherein an edge of at least one of upper and lower ends of the first and second opening patterns is chamfered to have a curved shape.

11. A flexible display device having a first region, a second region and a third region defined between the first region and the second region, and bendable with respect to a center axis extending along a first direction at the third region, comprising:
- a bendable flexible display panel; and
- a bendable back cover disposed on a non-displaying side of the flexible display panel and having a plurality of first opening patterns in odd-numbered columns along the first direction, and a plurality of second opening patterns in even-numbered columns along the first direction at the third region,
- wherein the first and second opening patterns have first and second portions, each opening pattern has a contour having a shortest width at a location where the first and second portions meet to minimize tensile stress on the third region with regard to repetitive bending actions.

12. The flexible display device of claim 11, wherein the first portion has a width becoming smaller in a second direction as the first portion progresses along the first direction and the second direction vertically intersecting the first direction, and the second portion extends from the second portion and having a width becoming greater in the second direction as the second portion progresses along the first direction,
- wherein the first portion of the first opening patterns adjacent to the second portion of the second opening patterns along the second direction, and the second portion of the first opening patterns arranged in the odd-numbered columns adjacent to the first portion of the second opening patterns.

13. The flexible display device of claim 12, wherein the first and second opening patterns partially overlap each other with respect to at least one reference line extending in parallel along the first direction.

14. The flexible display device of claim 12, wherein the first and second opening patterns have a symmetrical shape with respect to a first center line crossing a center of the first and second opening patterns along the first direction.

15. The flexible display device of claim 12, wherein the first and second opening patterns have a symmetrical shape with respect to a second center line crossing a center of the first and second opening patterns along the second direction.

16. The flexible display device of claim 12, wherein at least one of the width of the first portion and the width of the second portion vary non-linearly along the first direction.

17. The flexible display device of claim 12, wherein a cross-sectional shape of the first and second opening patterns has a trapezoidal shape.

18. The flexible display device of claim 12, further comprising a step compensation layer filling the first and second opening patterns.

19. The flexible display device of claim 18, wherein the step compensation layer covers a front surface of the back cover.

20. The flexible display device of claim 18, wherein the step compensation layer includes a multi-layer in which layers with different modulus are stacked.

* * * * *